United States Patent
Kim (10) Patent No.: US 8,421,343 B2
(45) Date of Patent: Apr. 16, 2013

(54) ORGANIC LIGHT EMITTING DISPLAY DEVICE AND MANUFACTURING METHOD THEREFOR

(75) Inventor: Eun-Ah Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 88 days.

(21) Appl. No.: 13/079,125

(22) Filed: Apr. 4, 2011

(65) Prior Publication Data

US 2011/0273082 A1    Nov. 10, 2011

(30) Foreign Application Priority Data

May 6, 2010    (KR) .................. 10-2010-0042419

(51) Int. Cl.
*H01J 1/62*       (2006.01)
*H01J 63/04*      (2006.01)

(52) U.S. Cl.
USPC ........... 313/504; 313/483; 313/498; 313/500; 313/501; 313/502; 313/503; 313/505

(58) Field of Classification Search .................. None
See application file for complete search history.

(56) References Cited

U.S. PATENT DOCUMENTS

| 8,179,029 | B2 * | 5/2012 | Boerner et al. | 313/1 |
| 2007/0194308 | A1 | 8/2007 | Kuo | |
| 2010/0164344 | A1 * | 7/2010 | Boerner et al. | 313/1 |

FOREIGN PATENT DOCUMENTS

| KR | 1020050067804 | 7/2005 |
| KR | 1020060116514 | 11/2006 |
| KR | 1020080020803 | 3/2008 |
| KR | 10-2008-0049702 | 6/2008 |
| KR | 10-2008-0089793 | 10/2008 |
| KR | 1020080103065 | 11/2008 |

OTHER PUBLICATIONS

English machine translation of KR 2006-116514 (Yoon).*
Korean Office Action issued on Sep. 29, 2011 in connection with Korean Patent Application Serial No. 10-2010-0042419 and Request for Entry of the Accompanying Office Action attached herewith.
Korean Notice of Allowance issued Apr. 25, 2012 in connection with Korean Patent Application Serial No. 10-2010-0042419 and Request for Entry of the Accompanying Office Action attached herewith.

* cited by examiner

*Primary Examiner* — Natalie Walford
(74) *Attorney, Agent, or Firm* — Robert E. Bushnell, Esq.

(57) ABSTRACT

Provided are an organic light emitting display device which can be simultaneously used as a mirror and a display screen in an external display device such as a mobile phone, and a manufacturing method for the organic light emitting display device. In one embodiment, an organic light emitting display device includes a first substrate and first transistors formed on the first substrate. A first organic light emitting diode is electrically connected to each of the first transistors. A second substrate is disposed opposite to the first substrate. Second organic light emitting diodes are formed on the second substrate. In the organic light emitting display device, a cathode electrode of each of the second organic light emitting diodes is formed of a reflective material.

15 Claims, 5 Drawing Sheets

ORGANIC LIGHT EMITTING DISPLAY DEVICE AND MANUFACTURING METHOD THEREFOR

CLAIM OF PRIORITY

This application makes reference to, incorporates the same herein, and claims all benefits accruing under 35 U.S.C. §119 from an application earlier filed in the Korean Intellectual Property Office on the 6$^{th}$ of May 2010 and there duly assigned Serial No. 10-2010-0042419.

BACKGROUND OF THE INVENTION

1. Field of the Invention

An aspect of the present invention relates to an organic light emitting display device and a manufacturing method therefor, and more particularly, to an organic light emitting display device having one surface on which a mirror and an image are displayed and the other surface on which an image is displayed, and a manufacturing method for the organic light emitting display device.

2. Description of the Related Art

A flat panel display device has a display area in which a plurality of pixels are arranged in a matrix form on a substrate, and the flat panel display device displays an image by selectively applying a data signal to the pixels through scan and data lines electrically connected to each of the pixels.

SUMMARY OF THE INVENTION

One embodiment of the present invention provides an organic light emitting display device which may be simultaneously used as a mirror and a display screen in an external display device such as a mobile phone. A manufacturing method for the organic light emitting display device is also provided.

In accordance with an aspect of the present invention, an organic light emitting display device may include a first substrate; first transistors formed on the first substrate; first organic light emitting diodes each electrically connected to each of the first transistors; a second substrate disposed opposite to and spaced apart from the first substrate; and second organic light emitting diodes formed on the second substrate, wherein a cathode electrode of each of the second organic light emitting diodes is formed of a reflective material.

In accordance with another aspect of the present invention, there is provided a manufacturing method for an organic light emitting display device, the method including steps of forming first transistors and first organic light emitting diodes on a first substrate; forming second organic light emitting diodes on a second substrate, wherein a cathode electrode of each of the second organic light emitting diodes is formed of a reflective material; and aligning the first and second substrates, wherein the first and second organic light emitting diodes are disposed opposite to each other.

In an organic light emitting display device and a manufacturing method therefor according to embodiments of the present invention, one display surface may be simultaneously used as a mirror and a display screen.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

In accordance with the methods of driving pixels, the flat panel display devices may be classified into passive matrix type light emitting display devices and active matrix type light emitting display devices. The active matrix type light emitting display devices in which each unit pixel is selectively turned on and off are frequently used because of the higher resolution, better contrast and higher operational speed.

The flat panel display devices may be used as display devices for the portable information terminals such as personal computers (PCs), mobile phones and personal digital assistants (PDAs) or monitors of various information devices. The flat panel display devices may include a liquid crystal display device (LCD) using a liquid crystal panel, an organic light emitting display device using organic light emitting elements, a plasma display panel (PDP) using a plasma panel, and the like.

Recently, there have been developed various types of flat panel display devices that are lighter in weight and smaller in volume than cathode ray tubes. Among these flat panel display devices, the organic light emitting display device has come into the spotlight because of higher light emitting efficiency, more excellent luminance, wider viewing angle and faster response speed.

In particular, active-type organic light emitting display devices implement higher resolution and have superior characteristics in terms of thickness, weight, price and the like as compared to other display devices. Hence, the active-type organic light emitting display devices are usefully applied to portable display devices such as cellular phones.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 1:
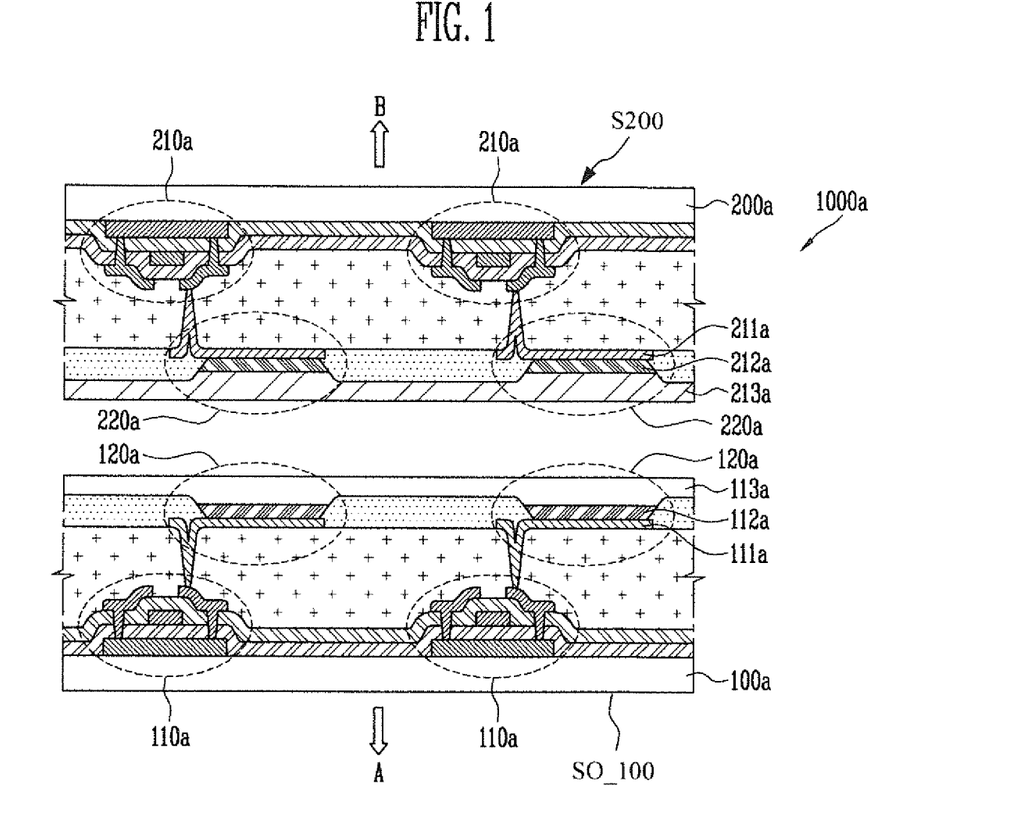
FIG. 1 is a partial cross sectional view of an organic light emitting display device constructed as an embodiment of the present invention.

FIG. 1 is a partial cross sectional view of an organic light emitting display device constructed as an embodiment of the present invention.

Referring to FIG. 1, the organic light emitting display device 1000a constructed as the embodiment of the present invention includes a first substrate 100a and a second substrate 200a. The first and second substrates may be formed of transparent material.

The first substrate 100a includes first transistors 110a and first organic light emitting diodes 120a. Each of the first transistors 110a receives a signal inputted from the exterior thereof to generate electric current and transfers the electric current generated to each of the first organic light emitting diodes 120a, so that the first organic light emitting diodes 120a emit light corresponding to the amount of the electric current generated. Thus, an active matrix type organic light emitting display device is formed on the first substrate 100a.

The second substrate 200a includes second transistors 210a and second organic light emitting diodes 220a. Each of the second transistors 210a receives a signal inputted from the exterior thereof to generate electric current and transfers the electric current generated to each of the second organic light emitting diodes 120a, so that the second organic light emitting diodes 120a emit light corresponding to the amount of the electric current. Thus, an active matrix type organic light emitting display device is formed on the second substrate 200a.

The first and second organic light emitting diodes 120a and 220a include anode electrodes 111a and 211a, organic layers 112a and 212a, and cathode electrodes 113a and 213a, respectively. When electric current flows from the anode electrode 111a or 211a to the cathode electrode 113a or 213a, light corresponding to the amount of the electric current is emitted from the organic layer 112a or 212a. Here, anode electrodes refer to electrodes electrically connected to a positive voltage potential and holes are mainly released from the anode electrodes, while the cathode electrodes refer to electrodes electrically connected to a negative voltage potential and electrons are mainly released from the cathode electrodes. The cathode 113a may be formed by either reflective or non-reflective material in accordance with different embodiments.

The anode electrodes 111a and 211a of the first and second organic light emitting diodes 120a and 220a are formed in island shapes on the first and second substrate 100a and 200a, respectively. The cathode electrodes 113a and 213a of the first and second organic light emitting diodes 120a and 220a are however deposited opposite to the first and second substrates 100a and 200a, respectively. The cathode electrode 113a may face toward the second substrate 200a and the cathode electrode 213a may face toward the first substrate 100a. Among the cathode electrodes 113a and 213a, the cathode electrode 213a of the second organic light emitting diode 220a is formed of a reflective material.

Since the cathode electrode 213a is formed of the reflective material, light emitted from the first organic light emitting diode 120a is reflected by the cathode electrode 213a and is then emitted only in a first direction A, and light emitted from the second organic light emitting diode 220a is emitted only in a second direction B. The reflective material may include one selected from the group consisting of aluminum (Al), silver (Ag), aluminum alloy and silver alloy. In one embodiment, the first direction A is opposite to the second direction B.

When the first and second organic light emitting diodes 120a and 220a do not emit light, external light is reflected by the cathode electrode 213a formed of the reflective material so that the cathode electrode 213a serves as a mirror.

The first and second substrates 100a and 200a are sealed using a sealing member (not shown), so that the sealing member may prevent moisture and the like from being penetrated into the first and second transistors 110a and 210a and the first and second organic light emitting diodes 120a and 220a.

Even though only the first and second transistors 110a and 210a and the first and second organic light emitting diodes 120a and 220a are shown in FIG. 1, a plurality of transistors and capacitors and wires may be formed on each of the first and second substrates 100a and 200a, based on the structure of a pixel circuit. Here, signals such as scan and data signals, pixel power sources, and the like may be transferred through the wires.

Figure 2:
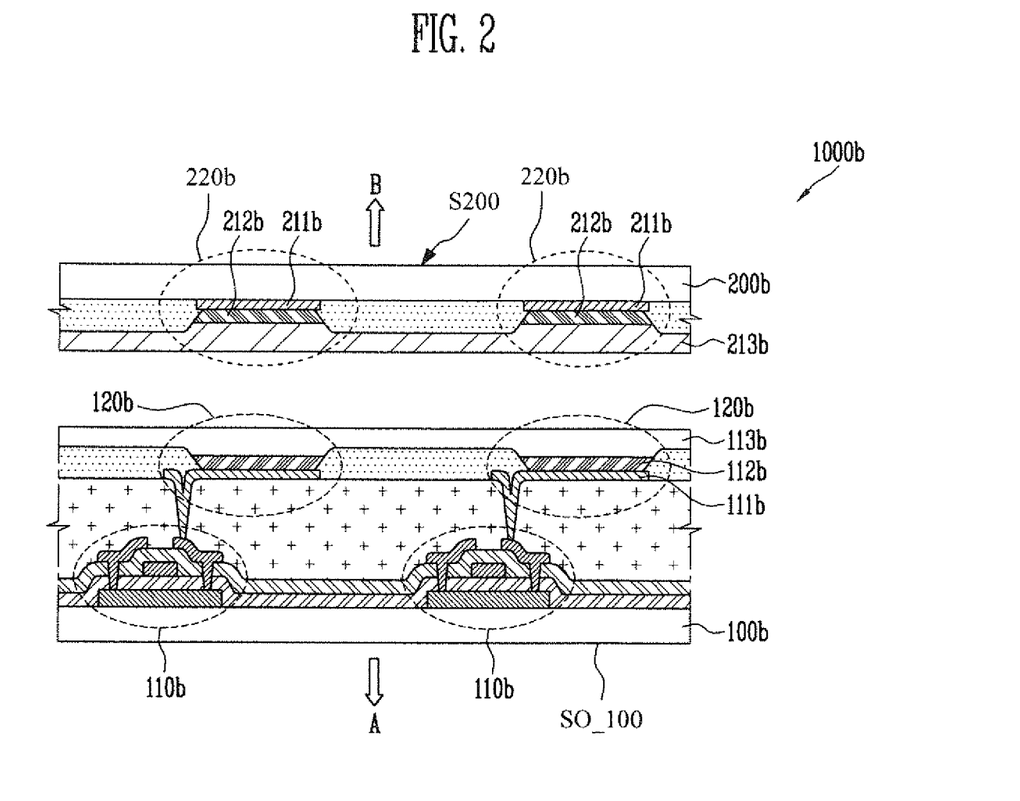
FIG. 2 is a partial cross sectional view of an organic light emitting display device constructed as another embodiment of the present invention.

FIG. 2 is a partial cross sectional view of an organic light emitting display device constructed as another embodiment of the present invention.

Referring to FIG. 2, the organic light emitting display device 1000b constructed as the embodiment of the present invention includes a first substrate 100b and a second substrate 200b.

The first substrate 100b includes first transistors 110b and first organic light emitting diodes 120b. Each of the first transistors 110b receives a signal inputted from the exterior thereof to generate electric current and transfers the electric current generated to each of the first organic light emitting diodes 120b, so that the first organic light emitting diodes 120b emit light corresponding to the amount of the electric current. Thus, an active matrix type organic light emitting display device is formed on the first substrate 100b.

The second substrate 200b includes second organic light emitting diodes 220b. Each of the second organic light emitting diodes 220b emits light corresponding to the amount of current in response to a signal transferred thereto. Thus, a passive matrix type organic light emitting display device is formed on the second substrate 200b.

The first and second organic light emitting diodes 120b and 220b include anode electrodes 111b and 211b, organic layers 112b and 212b, and cathode electrodes 113b and 213b, respectively. When current flows from the anode electrode 111b or 211b to the cathode electrode 113b or 213b, light corresponding to the amount of the current is emitted from the organic layer 112b or 212b.

The anode electrodes 111b and 211b of the first and second organic light emitting diodes 120b and 220b are formed in island shapes on the first and second substrate 100b and 200b, respectively. The cathode electrodes 113b and 213b of the first and second organic light emitting diodes 120b and 220b are however deposited opposite to the first and second substrates 100b and 200b, respectively. Among the cathode electrodes 113b and 213b, the cathode electrode 213b of the second organic light emitting diode 220b is formed of a reflective material.

Since the cathode electrode 213b is fanned of the reflective material, light emitted from the first organic light emitting diode 120b is reflected by the cathode electrode 213b and then emitted only in the first direction A, and light emitted from the second organic light emitting diode 220b is emitted only in the second direction B. The reflective material may include one selected from the group consisting of aluminum (Al), silver (Ag), aluminum alloy and silver alloy.

When the first and second organic light emitting diodes 120b and 220b do not emit light, external light is reflected by the cathode electrode 213b formed of the reflective material so that the cathode electrode 213b serves as a mirror.

The first and second substrates 100a and 200a are sealed using a sealing member (not shown), so that the sealing member may prevent moisture and the like from being penetrated into the first transistors 110b and the first and second organic light emitting diodes 120a and 220a.

Even though only the first transistors 110b and the first and second organic light emitting diodes 120b and 220b are shown in FIG. 2, a plurality of transistors and capacitors and wires may be formed on the first substrate 100b, based on the structure of a pixel circuit. Here, signals such as scan and data signals, pixel power sources, and the like are transferred through the wires.

As shown in FIGS. 1 and 2, the lower surface of the cathode 213a may be spaced apart from the upper surface of the cathode 113a.

Figure 3A:
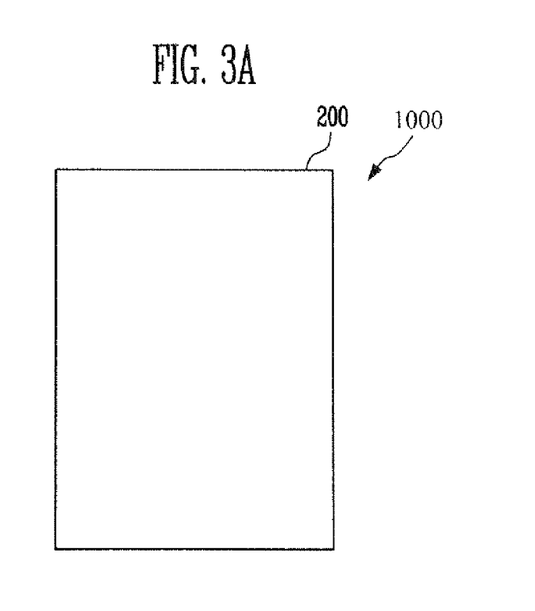
FIG. 3A is a plan view of an organic light emitting display device viewed from a second direction B when the second organic light emitting diodes do not emit light.
Figure 3B:
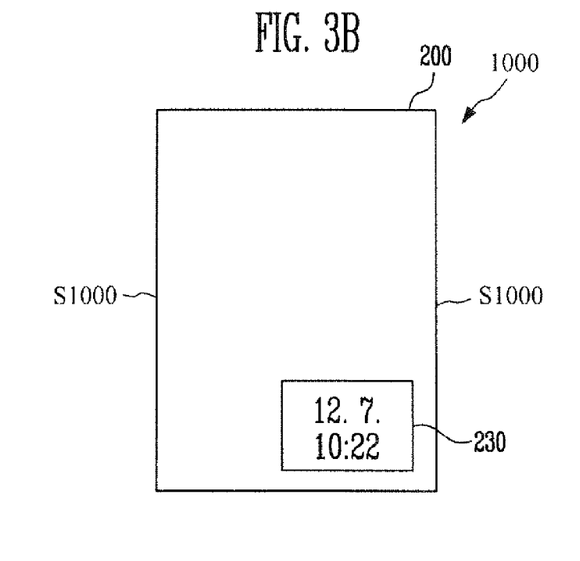
FIG. 3B is a plan view of the organic light emitting display device viewed from a second direction. B when the second organic light emitting diodes emit light.
Figure 3C:
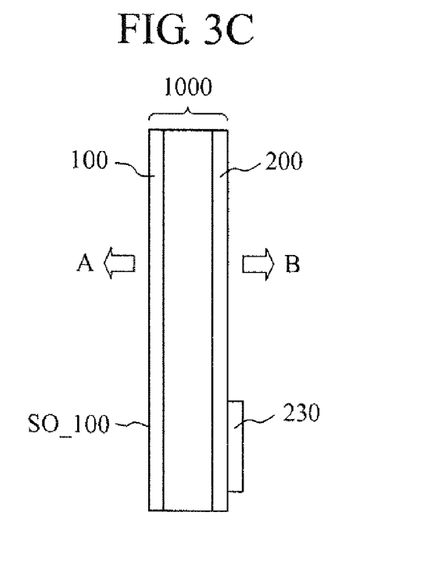
FIG. 3C is a side view of the organic light emitting display device viewed from one side of the organic light emitting display device of FIG. 3B.

FIG. 3A is a plan view of an organic light emitting display device 100 viewed from a second direction B when the second organic light emitting diodes do not emit light. FIG. 3B is a plan view of the organic light emitting display device 100 viewed from a second direction B when it emits light. FIG. 3C is a side view of the organic light emitting display device 1000 view from one side S1000 of the organic light emitting display device 1000 of FIG. 3B.

Referring to FIGS. 3A, 1A and 2A, when the organic light emitting display device 1000a, 1000b, 1000 is viewed from the second direction B, the upper surface S200 of a second substrate 200 (i.e., the second substrate 200a of FIG. 1 and the second substrate 200b of FIG. 2) is viewed in FIG. 3A. When second organic light emitting diodes on the second substrate 200 do not emit light, external light is reflected from cathode electrodes 213b of the second organic light emitting diodes, so that the organic light emitting display device serves as a mirror.

Referring to FIGS. 3B and 3C, when the second organic light emitting diodes emit light, light is emitted from the second organic light emitting diodes, thereby display an image. In this case, the displayed image may be a stopped screen 230 that shows information including a date, a time and the like.

In one embodiment, unlike the screen 230 of FIG. 3B which is disposed on a partial region of the second substrate 200, the images may be displayed on an entirety of a screen which is disposed on the entirety of the second substrate 200.

As shown in FIGS. 3B and 3C, when the stopped screen 230 is formed only in a partial region of the second substrate 200, the second transistors and the second organic light emitting diodes may be formed not on the whole second substrate 200 but be formed only at a certain region of the second substrate 200. In this case, the second organic light emitting diodes of FIGS. 1 and 2 may be formed only in a partial region of the second substrate 200a or 200b.

Figure 4:
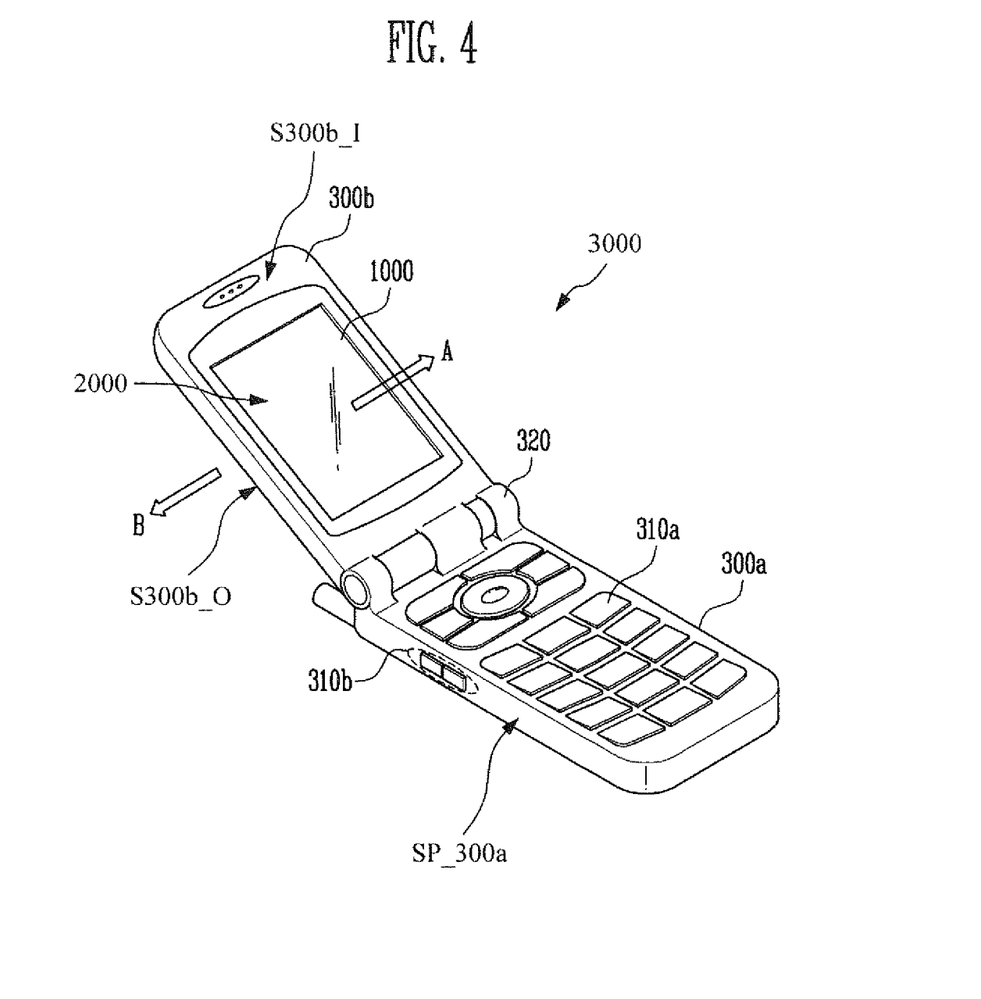
FIG. 4 is a perspective view of a folder-type portable device including an organic light emitting display device constructed as the principles of the present invention.

FIG. 4 is a perspective view of a folder-type portable device 3000 including the organic light emitting display device 1000.

Referring to FIG. 4, the folder-type portable device 3000 is divided into a first unit 300b in which a screen 2000 is displayed and a second unit 300a in which user input portions 310a and 310b such as keypad buttons are formed. The first and second units 300b and 300a are connected by a hinge 320. The first and second units 300b and 300a are in a state that they are folded or in a state that they are unfolded.

An organic light emitting display device 1000 constructed as an embodiment of the present invention may be formed in the first unit 300b. In the state that the folder-type portable device is folded, an inner surface S300b_I of the first unit 300b that comes in contact with the second unit 300a becomes a first direction A, and an outer surface S300b_O of the first unit 300b that does not come in contact with the second unit 300a becomes a second direction B. In one embodiment, the second substrate 200 is disposed neighboring to the inner surface S300b_I of the first unit 300b, and the first substrate 100 is disposed neighboring to the outer surface S300b_O of the first unit 300b.

When the first and second units 300b and 300a are folded, light is generally not emitted from first and second substrate 100 and 200 of the organic light emitting display device. In this case, the organic light emitting display device 1000 serves as a mirror.

When the first and second units 300b and 300a are unfolded, light is generally emitted from the first substrate 100, thereby displaying an image.

In the state that the first and second units 300b and 300a are folded and the user input portion 310b formed at a side portion $SP_{13}$ 300a of the second unit 300a is operated by a user, light may be emitted from the second substrate 200. When light is emitted from the second substrate 200 in the state that the first and second units 300b and 300a are folded and the user input portion 310b is operated by the user, a stopped screen 230 that shows information including a data, a time and the like may be displayed.

A touch sensing unit (not shown) may be formed at an upper portion (e.g., the outer surface SO_100 of FIG. 1 and screen 2000 of FIG. 4) of the first unit 300b, and light is emitted from the first substrate 100 upon a touch is sensed by the touch sensing unit. The touch sensing unit may be implemented as a touch panel stacked on an outer surface SO_100 of the first substrate 100.

Generally, the touch panel may include two panels which are isolated from each other by a spacer (not shown) and are arranged to come in contact with each other through the press of the spacer. Such touch panels are divided into a resistive overlay touch panel, a capacitive touch panel, an ultrasonic touch panel, and the like. The various types of touch panels are different from one another in designs, processing techniques and the like. Particularly, the resistive overlay touch panel may include a transparent upper film having an upper electrode formed thereon, a transparent lower substrate having a lower electrode formed thereon, and a spacer formed to have a certain space between the upper film and the lower substrate. In the resistive overlay touch panel, if the upper film and the lower substrate come in contact with each other by pressurizing the upper film through an input means such as a finger or pen, electric current may be applied to the upper electrode formed on the upper film and the lower electrode formed on the lower substrate.

In the present invention, the cathode electrode may be formed by material having lower work function in comparison to the anode electrode.

Figure 5:
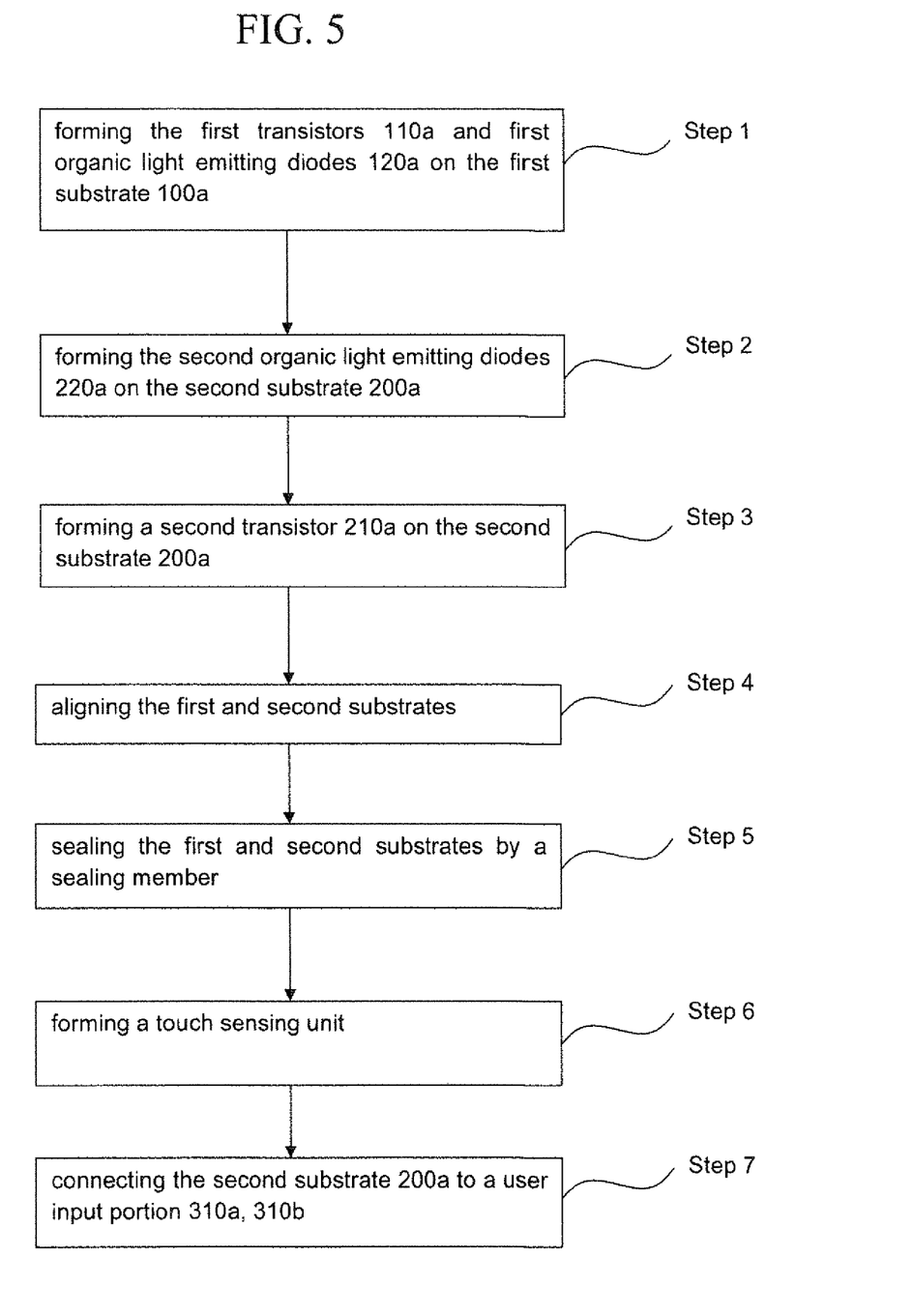
FIG. 5 is a flowchart showing a manufacturing method for making an organic light emitting display device in accordance with an embodiment of the present invention.

FIG. 5 shows a manufacturing method for making an organic light emitting display device in accordance with an embodiment of the present invention.

The method includes steps of forming the first transistors 110a and first organic light emitting diodes 120a on the first substrate 100a (Step 1); forming the second organic light emitting diodes 220a on the second substrate 200a, wherein a cathode electrode 213a of each of the second organic light emitting diodes 220a is formed of a reflective material and the cathode electrode 213a faces towards the first substrate 100a (Step 2); and aligning the first and second substrates, wherein the first and second organic light emitting diodes are disposed opposite to each other (Step 4).

This method may further include a step of forming a second transistor 210a on the second substrate 200a for controlling electric current that flows in each of the second organic light emitting diodes between the second substrate and the second organic light emitting diodes. (Step 3)

This method may further include a step of sealing the first and second substrates by a sealing member. (Step 5)

This method may further include a step of forming a touch sensing unit on a first major surface of the organic light emitting display device opposite to a second major surface of the organic light emitting display device on which the second organic light emitting diodes are formed, wherein light is emitted from the second organic light emitting diodes upon a touch is sensed by the touch sensing unit. (Step 6)

This method may further include a step of connecting the second substrate to a user input portion 310a, 310b, wherein light is emitted from the second organic light emitting diodes upon an input is inputted from the user input portion. (Step 7)

In this method, the second transistors and the second organic light emitting diodes may be formed only in a partial region of the second substrate.

In this method, the second transistors and the second organic light emitting diodes may be formed in an entirety of the second substrate.

In this method, the reflective material forming the cathode electrode 213a may include one selected from the group consisting of aluminum (Al), silver (Ag), aluminum alloy and silver alloy.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
   a first substrate;
   a plurality of first transistors formed on the first substrate;
   each of a plurality of first organic light emitting diodes electrically connected to each of the plurality of first transistors;
   a second substrate disposed opposite to and spaced apart from the first substrate;
   a plurality of second organic light emitting diodes formed on the second substrate, with a cathode electrode of each of the plurality of second organic light emitting diodes being formed of a reflective material; and
   a user input portion connected to the second substrate, with light emitted from the plurality of second organic light emitting diodes upon an input is inputted from the user input portion.

2. The organic light emitting display device according to claim 1, wherein the reflective material includes one selected from the group consisting of aluminum (Al), silver (Ag), aluminum alloy and silver alloy.

3. The organic light emitting display device according to claim 1, further comprising a touch sensing unit formed on a first surface of the organic light emitting display device opposite to a second surface of the organic light emitting display device on which the plurality of second organic light emitting diodes are formed,
   wherein light is emitted from the plurality of second organic light emitting diodes upon a touch is sensed by the touch sensing unit.

4. The organic light emitting display device according to claim 1, wherein a space disposed between the first and second substrates is sealed by a sealing member.

5. The organic light emitting display device according to claim 1, wherein second transistors and the plurality of second organic light emitting diodes are formed only in a partial region of the second substrate.

6. The organic light emitting display device according to claim 1, further comprising a second transistor disposed on the second substrate for controlling electric current that flows in each of the plurality of second organic light emitting diodes between the second substrate and the plurality of second organic light emitting diodes.

7. A manufacturing method for an organic light emitting display device, the method comprising:
   forming first transistors and first organic light emitting diodes on a first substrate;
   forming second organic light emitting diodes on a second substrate, wherein a cathode electrode of each of the second organic light emitting diodes is formed of a reflective material and the cathode electrode faces towards the first substrate;
   aligning the first and second substrates, wherein the first and second organic light emitting diodes are disposed opposite to each other; and
   connecting the second substrate to a user input portion, with light emitted from the second organic light emitting diodes upon an input is inputted from the user input portion.

8. The method according to claim 7, wherein the reflective material comprises one selected from the group consisting of aluminum (Al), silver (Ag), aluminum alloy and silver alloy.

9. The method according to claim 7, further comprising a step of forming a touch sensing unit on a first surface of the organic light emitting display device opposite to a second surface of the organic light emitting display device on which the second organic light emitting diodes are formed,
   wherein light is emitted from the second organic light emitting diodes upon a touch is sensed by the touch sensing unit.

10. The method according to claim 7, further comprising a step of sealing a space disposed between the first and second substrates by a sealing member.

11. The method according to claim 7, wherein forming second transistors and the second organic light emitting diodes only in a partial region of the second substrate.

12. The method according to claim 7, further comprising a step of forming a second transistor on the second substrate for controlling electric current that flows in each of the second organic light emitting diodes between the second substrate and the second organic light emitting diodes.

13. An organic light emitting display device, comprising:
   a first substrate and a second substrate disposed opposite to and spaced apart from each other;
   a first transistor formed on a major surface of the first substrate, with the major surface facing towards the second substrate;
   a first organic light emitting diode electrically connected to the first transistor;
   a second organic light emitting diode formed on the second substrate, with an electrode of the second organic light emitting diode being formed of a reflective material and the electrode facing toward the first substrate; and
   a touch sensing unit formed on a first surface of the organic light emitting display device opposite to a second surface of the organic light emitting display device on which the second organic light emitting diode is formed, with light emitted from the second organic light emitting diode upon a touch is sensed by the touch sensing unit.

14. The organic light emitting display device according to claim 13, further comprising a second transistor formed on the second substrate, and the second transistor being electrically connected to the second organic light emitting diode.

15. The organic light emitting display device according to claim 13, wherein the reflective material includes one selected from the group consisting of aluminum (Al), silver (Ag), aluminum alloy and silver alloy.

* * * * *